United States Patent
Tan

(10) Patent No.: US 8,884,626 B2
(45) Date of Patent: Nov. 11, 2014

(54) DEVICE CALIBRATION FOR BATTERY TYPE IDENTIFICATION

(75) Inventor: Li-Quan Tan, Sunnyvale, CA (US)

(73) Assignee: Apple Inc., Cupertino, CA (US)

(*) Notice: Subject to any disclaimer, the term of this patent is extended or adjusted under 35 U.S.C. 154(b) by 1114 days.

(21) Appl. No.: 12/822,924

(22) Filed: Jun. 24, 2010

(65) Prior Publication Data
US 2011/0309839 A1 Dec. 22, 2011

Related U.S. Application Data

(60) Provisional application No. 61/356,920, filed on Jun. 21, 2010.

(51) Int. Cl.
*G01N 27/416* (2006.01)
*G01R 31/36* (2006.01)

(52) U.S. Cl.
CPC .................... *G01R 31/3665* (2013.01)
USPC ........................... 324/433; 320/106

(58) Field of Classification Search
USPC ............................ 324/433; 320/106
See application file for complete search history.

(56) References Cited

U.S. PATENT DOCUMENTS

| 5,489,834 | A | * | 2/1996 | Pitkanen | 320/106 |
| 5,506,490 | A | * | 4/1996 | DeMuro | 320/106 |
| 5,717,306 | A | * | 2/1998 | Shipp | 307/125 |
| 5,783,926 | A | * | 7/1998 | Moon et al. | 320/106 |
| 5,912,544 | A | * | 6/1999 | Miyakawa et al. | 320/106 |
| 2006/0197492 | A1 | * | 9/2006 | Wendelrup et al. | 320/106 |

* cited by examiner

*Primary Examiner* — Samuel Berhanu
(74) *Attorney, Agent, or Firm* — Park, Vaughan, Fleming & Dowler LLP; Chia-Hsin Suen

(57) ABSTRACT

Some embodiments provide a system that facilitates use of an electronic device. The electronic device may be a keyboard, a mouse, a trackpad, a remote control, a wireless phone, a toy, a battery charger, and/or a camera. During operation, the system measures a loaded voltage of a calibrated voltage source connected to the electronic device. To measure the loaded voltage, the calibrated voltage source is connected to a known load in the electronic device, and a voltage measurement for the calibrated voltage source is obtained using an analog-to-digital converter (ADC) in the electronic device.

16 Claims, 5 Drawing Sheets

DEVICE CALIBRATION FOR BATTERY TYPE IDENTIFICATION

RELATED APPLICATION

This application hereby claims priority under 35 U.S.C. §119 to U.S. Provisional Application No. 61/356,920, entitled "Device Calibration for Battery Type Identification," by Li-Quan Tan, filed 21 Jun. 2010.

BACKGROUND

1. Field

The present embodiments relate to techniques for automatically identifying battery types. More specifically, the present embodiments relate to techniques for calibrating electronic devices to facilitate accurate identification of the types of batteries used with the electronic devices.

2. Related Art

Standard-sized batteries may be used to power a variety of electronic devices. For example, AA and/or AAA batteries may be used in devices such as cameras, toys, flashlights, peripheral devices, remote controls, and/or portable media players. Furthermore, such batteries may be rechargeable or non-rechargeable. For example, a digital camera may accept both rechargeable nickel cadmium (Ni—Cd) and/or nickel-metal-hydride (Ni-MH) AA batteries and non-rechargeable alkaline AA batteries.

On the other hand, rechargeable and non-rechargeable batteries may include electrical and chemical differences that affect the operation of electronic devices with the batteries. First, rechargeable batteries typically have a lower output voltage (e.g., 1.25 volts per cell) than non-rechargeable batteries (e.g., 1.5 volts per cell). Consequently, electronic devices intended for use with non-rechargeable batteries may not operate properly with lower-voltage rechargeable batteries. Along the same lines, voltage-based battery "gas gauges" in the electronic devices may convert measurements of the batteries' voltages to state of charge values using discharge curves for non-rechargeable batteries, resulting in inaccurate state of charge measurements during use of the electronic devices with rechargeable batteries.

Second, non-rechargeable batteries are generally not designed for use with battery chargers. Furthermore, attempts to recharge non-rechargeable batteries may cause ruptures of the batteries and/or leaks of hazardous substances from the batteries. For example, attempting to recharge an alkaline battery may cause potassium hydroxide to leak from the alkaline battery, which in turn may damage the circuitry of the battery charger and/or other electronic devices to which the alkaline battery is connected.

Hence, use of battery-powered electronic devices may be facilitated by correctly identifying the types of batteries connected to the electronic devices and configuring the electronic devices for use with the batteries.

SUMMARY

Some embodiments provide a system that facilitates use of an electronic device. The electronic device may be a keyboard, a mouse, a trackpad, a remote control, a wireless phone, a toy, a battery charger, and/or a camera. During operation, the system measures a loaded voltage of a calibrated voltage source connected to the electronic device. To measure the loaded voltage, the calibrated voltage source is connected to a known load in the electronic device, and a voltage measurement for the calibrated voltage source is obtained using an analog-to-digital converter (ADC) in the electronic device.

Next, the system calculates the parasitic resistance of the electronic device on the loaded voltage, the known internal voltage of the calibrated voltage source, and the known internal resistance of the calibrated voltage source. To calculate the parasitic resistance, the internal resistance of the calibrated voltage source is calculated from the loaded voltage, the known internal voltage, and the known internal resistance using a microcontroller unit (MCU) in the electronic device, and the known internal resistance is subtracted from the calculated internal resistance.

Finally, the system uses the parasitic resistance to facilitate use of the electronic device with the battery. For example, the parasitic resistance may be stored in the electronic device to enable calculation of the internal resistance of the battery based on the parasitic resistance. Because the internal resistance calculation accounts for the parasitic resistance of the electronic device, accurate identification of the battery as rechargeable or non-rechargeable may be enabled. The system may then determine a state of charge of the battery based on the battery type, use the battery to power the electronic device based on the state of charge, and/or charge the battery based on the state of charge and the battery type.

BRIEF DESCRIPTION OF THE FIGURES

In the figures, like reference numerals refer to the same figure elements.

DETAILED DESCRIPTION

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present invention is not limited to the embodiments shown, but is to be accorded the widest scope consistent with the principles and features disclosed herein.

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing code and/or data now known or later developed.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium.

Furthermore, methods and processes described herein can be included in hardware modules or apparatus. These modules or apparatus may include, but are not limited to, an application-specific integrated circuit (ASIC) chip, a field-programmable gate array (FPGA), a dedicated or shared processor that executes a particular software module or a piece of code at a particular time, and/or other programmable-logic devices now known or later developed. When the hardware modules or apparatus are activated, they perform the methods and processes included within them.

Figure 1:
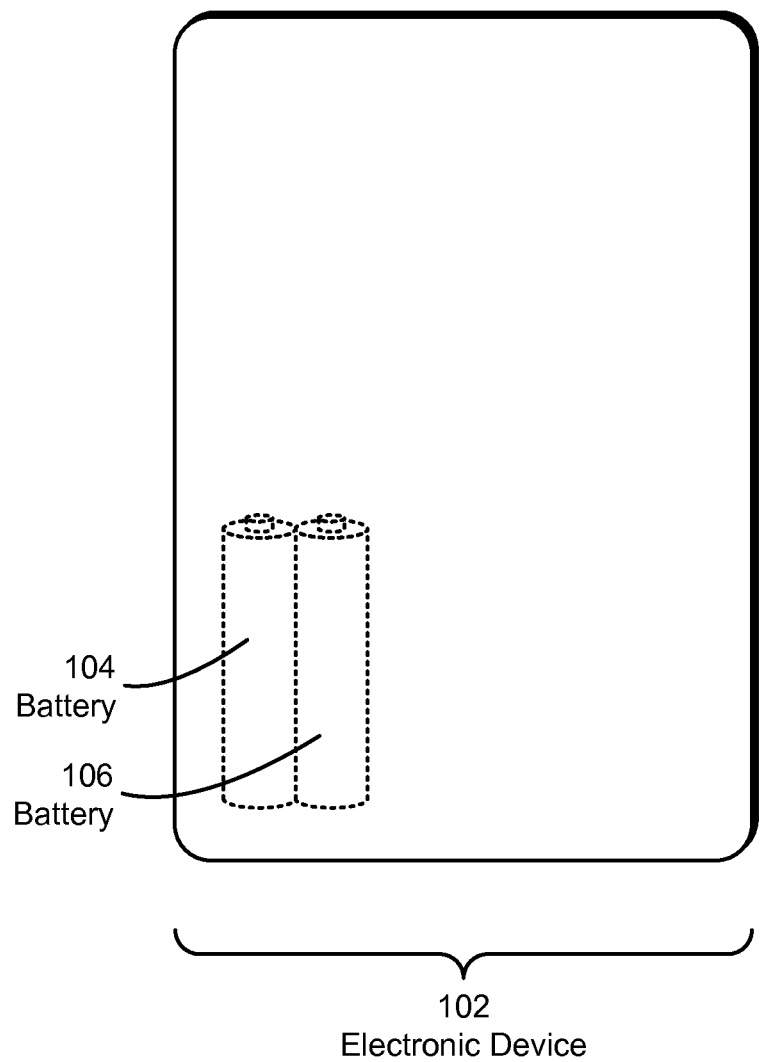
FIG. 1 shows an electronic device in accordance with an embodiment.

FIG. 1 shows an electronic device 102 in accordance with an embodiment. Electronic device 102 may correspond to a keyboard, a mouse, a trackpad, a remote control, a wireless phone, a toy, a battery charger, a camera, and/or other device that operates with one or more batteries 104-106. In addition, electronic device 102 may be used with standard-sized batteries such as AAA batteries, AA batteries, C batteries, D batteries, and/or nine-volt batteries.

While standard-sized batteries (e.g., batteries 104-106) may be rechargeable or non-rechargeable, electronic device 102 may or may not be operable with both rechargeable and non-rechargeable batteries. For example, electronic device 102 may be a peripheral device that is capable of drawing power from two rechargeable (e.g., nickel cadmium (Ni—Cd), nickel-metal-hydride (Ni-MH), etc.) or non-rechargeable (e.g., alkaline, lithium, etc.) AA batteries. Alternatively, electronic device 102 may be a battery charger that supplies current to only rechargeable AA or AAA batteries.

More specifically, rechargeable and non-rechargeable batteries may be associated with different electrical and chemical characteristics that affect the operation of electronic device 102 with batteries 104-106. First, rechargeable and non-rechargeable batteries may have different capacities and/or output voltages. For example, a rechargeable AA battery may have an output voltage of 1.25 volts per cell, while a non-rechargeable AA battery may have an output voltage of 1.5 volts per cell. As a result, electronic device 102 may not operate properly with rechargeable AA batteries if electronic device 102 is designed for use with non-rechargeable AA batteries. Moreover, a voltage-based battery "gas gauge" in electronic device 102 may convert voltage measurements from batteries 104-106 into state of charge values using discharge curves for non-rechargeable batteries, resulting in inaccurate state of charge measurements if batteries 104-106 are rechargeable.

Second, the chemistry of non-rechargeable batteries may be unsuited and/or unsafe for use with battery chargers. For example, attempting to recharge a non-rechargeable alkaline battery may result in the leaking of potassium hydroxide from and/or rupture of the alkaline battery. The leak and/or rupture may further damage the circuitry of electronic device 102 if electronic device 102 is connected to the alkaline battery.

Consequently, the operation of electronic device 102 with batteries 104-106 may be facilitated by identifying the battery type (e.g., rechargeable or non-rechargeable) of one or both batteries. In one or more embodiments, electronic device 102 utilizes differences in the internal resistances of rechargeable and non-rechargeable batteries to differentiate between the two types of batteries. For example, electronic device 102 may identify rechargeable AA batteries as those with lower internal resistance (e.g., 50 milliohms) and non-rechargeable batteries as those with higher internal resistance (e.g., 150 milliohms).

Furthermore, electronic device 102 may increase the accuracy of the internal resistance calculation by subtracting the parasitic resistance of electronic device 102 from the calculated internal resistance. Electronic device 102 may then use the internal resistance to identify a battery type of the battery, determine a state of charge of the battery based on the battery type, use the battery to power the electronic device based on the state of charge, and/or charge the battery based on the state of charge and the battery type. Resistance-based identification of battery types to facilitate use of electronic devices is discussed in further detail below with respect to FIG. 2.

Figure 2:
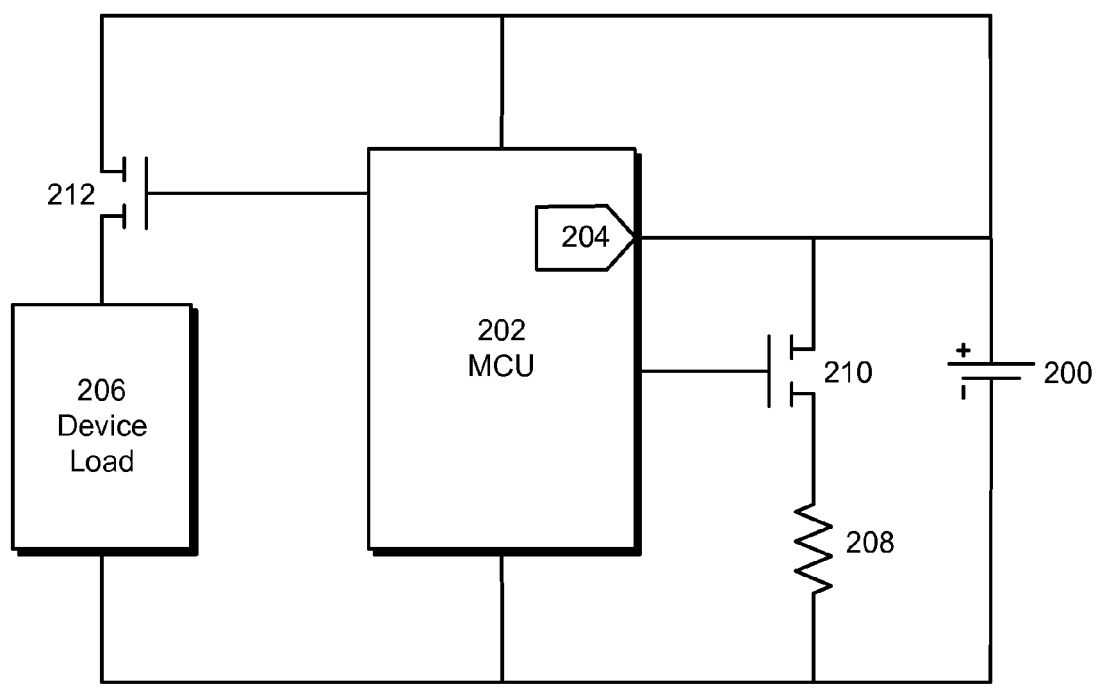
FIG. 2 shows a system for configuring an electronic device for use with a battery in accordance with an embodiment.

FIG. 2 shows a system for configuring an electronic device (e.g., electronic device 102 of FIG. 1) for use with a battery 200 in accordance with an embodiment. The system includes a microcontroller unit (MCU) 202 and an analog-to-digital converter (ADC) 204. In addition, the system may be implemented within the electronic device to facilitate accurate identification of the battery type of battery 200.

In particular, MCU 202 and ADC 204 may identify battery 200 as rechargeable or non-rechargeable based on the internal resistance of battery 200, which in turn may be based on one or more voltage measurements from battery 200. As shown in FIG. 2, two switches 210-212 are connected to MCU 202. Switches 210-212 may correspond to field-effect transistors (FETs), diodes, and/or other electronic components with switching capability.

To determine the battery type of battery 200, MCU 202 may disconnect a device load 206 of the electronic device from battery 200 using switch 212. MCU 202 may also open switch 210 to allow ADC 204 to measure an open circuit voltage of battery 200. Next, MCU 202 may close switch 210 so that ADC 204 may measure a loaded voltage of battery 200 with known load 208 connected to battery 200. The internal resistance of battery 200 may then be calculated using the following equation:

$$R_S = \frac{V_{Open} - V_{Load}}{V_{Load}} R_{Load}$$

Within the equation, $R_s$ may represent the internal resistance of battery 200, $V_{open}$ may represent the open circuit voltage, $V_{Load}$ may represent the loaded voltage, and $R_{Load}$ may represent the known resistance of known load 208.

Those skilled in the art will appreciate that MCU 202 may calculate internal resistance in a variety of ways. For example, MCU 202 may use a current measurement from a current sensor connected to battery 200 to calculate the internal resistance of battery 200. As a result, the system of FIG. 2 may be modified to accommodate other methods for calculating internal resistances of voltage sources.

As mentioned above, rechargeable batteries may be associated with lower internal resistances than non-rechargeable batteries. MCU 202 may thus identify the battery type of battery 200 by comparing the calculated internal resistance of battery 200 with stored values of internal resistances for rechargeable and non-rechargeable batteries. For example, MCU 202 may identify battery 200 as rechargeable if the calculated internal resistance is around 50 milliohms and as non-rechargeable if the calculated internal resistance is around 150 milliohms. MCU 202 may then calculate the state of charge of battery 200 using a discharge curve for the identified battery type and/or perform other operations related to use of the electronic device with the battery.

However, the equation above may produce an internal resistance value that does not account for parasitic resistance from wires, battery contacts, printed circuit boards (PCBs), and/or the enclosure of the electronic device. Moreover, the parasitic resistance may vary among electronic devices and contribute to inaccuracies during identification of the battery type of battery 200. For example, battery contact resistance may vary from 20 milliohms to 150 milliohms as a function of the mechanical spring force and/or other mechanical attributes of the battery contacts, while a 100 mm long trace on a PCB may have a resistance of about 25 milliohms. As a result, the parasitic resistance may impact the value of the internal resistance of battery 200 enough to cause battery 200 to be identified as non-rechargeable when battery 200 is rechargeable.

In one or more embodiments, MCU 202 and ADC 204 include functionality to calculate the internal resistance of battery 200 based on the parasitic resistance of the electronic device. Instead of using the equation above, MCU 202 may use the following to calculate the internal resistance of battery 200:

$$R_S = \frac{V_{Open} - V_{Load}}{V_{Load}} R_{Load} - R_{Parasitic}$$

In other words, the parasitic resistance $R_{Parasitic}$ may be subtracted from the internal resistance to obtain a more accurate value for the internal resistance.

Moreover, MCU 202 and ADC 204 may obtain and store a value for the parasitic resistance prior to use of the electronic device (e.g., immediately after the electronic device is assembled). In particular, a calibrated voltage source with a known internal voltage and a known internal resistance may be connected to the electronic device in lieu of battery 200. For example, the calibrated voltage source may correspond to a dummy battery with the same shape and contact size as battery 200 (e.g., a standard-sized battery). The dummy battery may be inserted into a battery compartment in the electronic device, and a software command may be executed to trigger the calculation of parasitic resistance using the dummy battery.

After the calibrated voltage source is connected to the electronic device, MCU 202 may measure the loaded voltage of the calibrated voltage source. As discussed above, the loaded voltage may correspond to voltage measured from the calibrated voltage source with switch 212 open and switch 210 closed. The parasitic resistance $R_{Parasitic}$ may then be calculated from the loaded voltage $V_{Load}$, the known internal voltage $V_{Cal}$ of the calibrated voltage source, the known resistance of known load 208 $R_{Load}$, and the known internal resistance of the calibrated voltage source $R_{Cal}$ using the following equation:

$$R_{Parasitic} = \frac{V_{Cal} - V_{Load}}{V_{Load}} R_{Load} - R_{Cal}$$

As a result, the parasitic resistance may be calculated by calculating the internal resistance of the calibrated voltage source from the loaded voltage, the known internal voltage, and the known internal resistance, then subtracting the known internal resistance from the calculated internal resistance. The parasitic resistance may thus correspond to the "error" in calculating the internal resistance from the loaded voltage, the known internal voltage, and the known internal resistance.

The parasitic resistance may then be stored in memory in the electronic device for subsequent use in calculating the internal resistance of battery 200. As described above, a more accurate value for the internal resistance may be obtained by calculating the internal resistance using the open circuit voltage and loaded voltage of battery 200 and subtracting the parasitic resistance from the internal resistance. In other words, the electronic device may be calibrated for the calculation of the internal resistances of batteries connected to the electronic device. The increase in accuracy may additionally result in better identification of the battery type of battery 200, which in turn may facilitate use of the electronic device with battery 200.

More specifically, accurate identification of the battery type of battery 200 may allow MCU 202 to determine the state of charge of battery 200 using the appropriate discharge curve for the battery type of battery 200. For example, MCU 202 may convert an output voltage of 1.25 volts from battery 200 into a state of charge of 100% if battery 200 is identified as rechargeable and 80% if battery 200 is identified as non-rechargeable. MCU 202 may also use battery 200 to power the electronic device based on the state of charge. For example, MCU 202 may prevent the electronic device from powering up if the state of charge is below a threshold that would cause the electronic device to stop working before power up is complete. Along the same lines, MCU 202 may enable charging of battery 200 based on the state of charge and the battery type of battery 200. For example, MCU 202 may allow a battery charger to charge battery 200 only if battery 200 is identified as rechargeable and the state of charge is below 95%.

Figure 3:
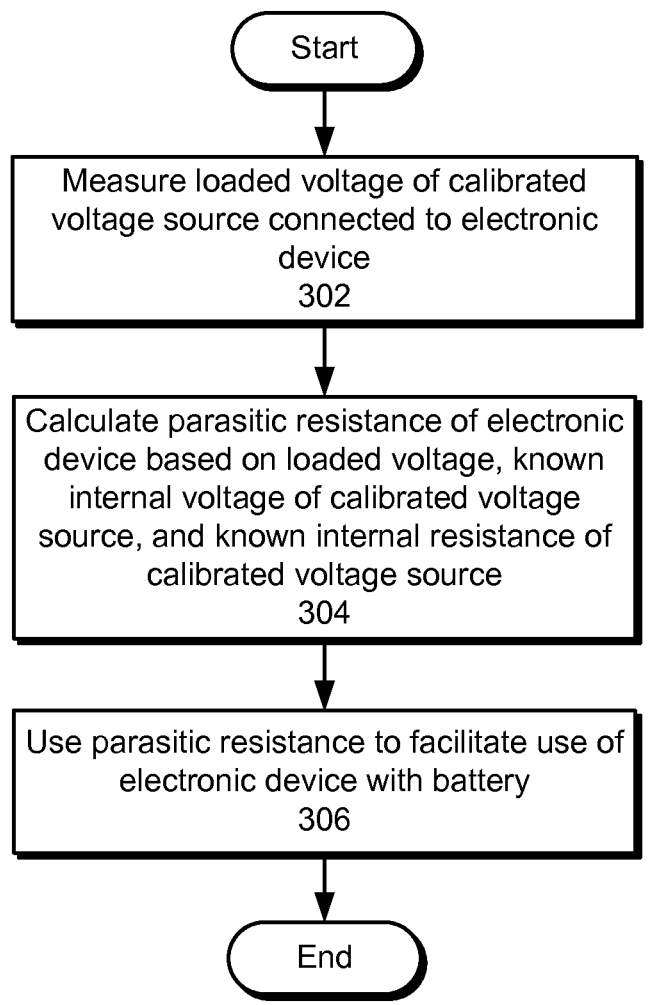
FIG. 3 shows a flowchart illustrating the process of configuring an electronic device in accordance with an embodiment.

FIG. 3 shows a flowchart illustrating the process of configuring an electronic device in accordance with an embodiment. In one or more embodiments, one or more of the steps may be omitted, repeated, and/or performed in a different order. Accordingly, the specific arrangement of steps shown in FIG. 3 should not be construed as limiting the scope of the embodiments.

First, a loaded voltage of a calibrated voltage source connected to the electronic device is measured (operation 302). To measure the loaded voltage, the calibrated voltage source is connected to a known load in the electronic device, and a voltage measurement for the calibrated voltage source is obtained using an ADC in the electronic device.

Next, the parasitic resistance of the electronic device is calculated based on the loaded voltage, the known internal voltage of the calibrated voltage source, and the known internal resistance of the calibrated voltage source (operation 304). To calculate the parasitic resistance, the internal resistance of the calibrated voltage source is calculated from the loaded voltage, the known internal voltage, and the known internal resistance using an MCU in the electronic device, and the known internal resistance is subtracted from the calculated internal resistance.

Finally, the parasitic resistance is used to facilitate use of the electronic device with the battery (operation 306). The parasitic resistance may be stored in the electronic device to enable calculation of the internal resistance of the battery based on the parasitic resistance. Because the internal resistance calculation accounts for the parasitic resistance of the electronic device, accurate identification of the battery as rechargeable or non-rechargeable may be enabled. The electronic device may then be used with the battery based on the battery type, as discussed below with respect to FIG. 4.

Figure 4:
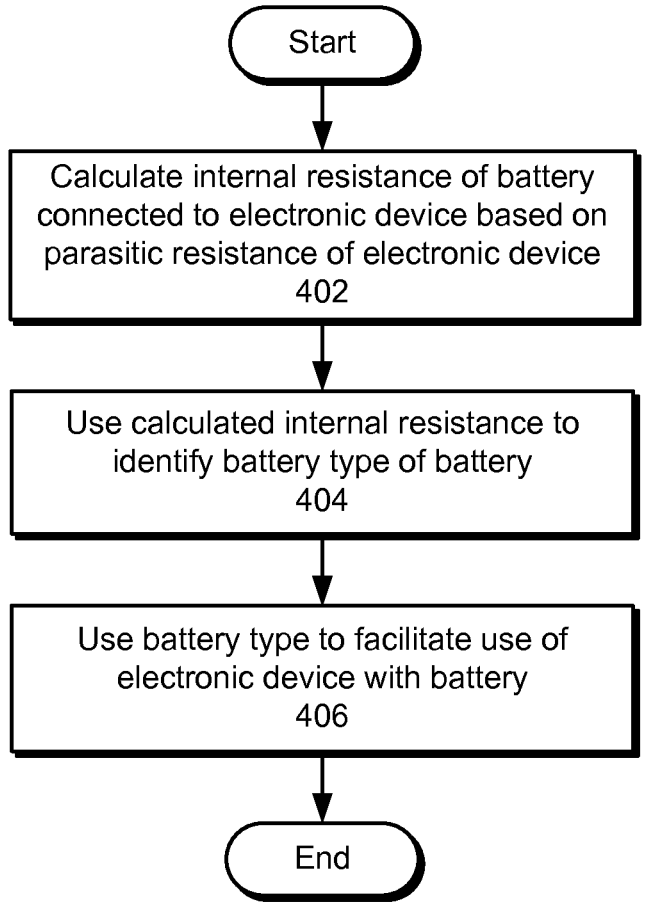
FIG. 4 shows a flowchart illustrating the process of operating an electronic device in accordance with an embodiment.

FIG. 4 shows a flowchart illustrating the process of operating an electronic device in accordance with an embodiment. In one or more embodiments, one or more of the steps may be omitted, repeated, and/or performed in a different order. Accordingly, the specific arrangement of steps shown in FIG. 4 should not be construed as limiting the scope of the embodiments.

Initially, the internal resistance of a battery connected to the electronic device is calculated based on the parasitic resistance of the electronic device (operation 402). The battery may correspond to a standard-sized battery, such as an AAA battery, AA battery, C battery, D battery, and/or nine-volt battery. The parasitic resistance may be stored in the electronic device and obtained using the process discussed above with respect to FIG. 3. To calculate the internal resistance, an open circuit voltage and a loaded voltage of the battery are measured, and the internal resistance is calculated using the open circuit voltage and the loaded voltage. The parasitic resistance is then subtracted from the internal resistance.

Next, the calculated internal resistance is used to identify the battery type of the battery (operation 404). For example, the battery may be identified as rechargeable if the internal resistance is around 50 milliohms and as non-rechargeable if the internal resistance is around 150 milliohms.

Finally, the battery type is used to facilitate use of the electronic device with the battery (operation 406). In particular, the state of charge of the battery may be determined based on the battery type (e.g., using a discharge curve for the battery type). The battery may then be used to power the electronic device based on the state of charge (e.g., if the state of charge exceeds a pre-specified threshold), or the battery may be charged based on the state of charge (e.g., if the state of charge is below a pre-specified value) and the battery type (e.g., rechargeable).

Figure 5:
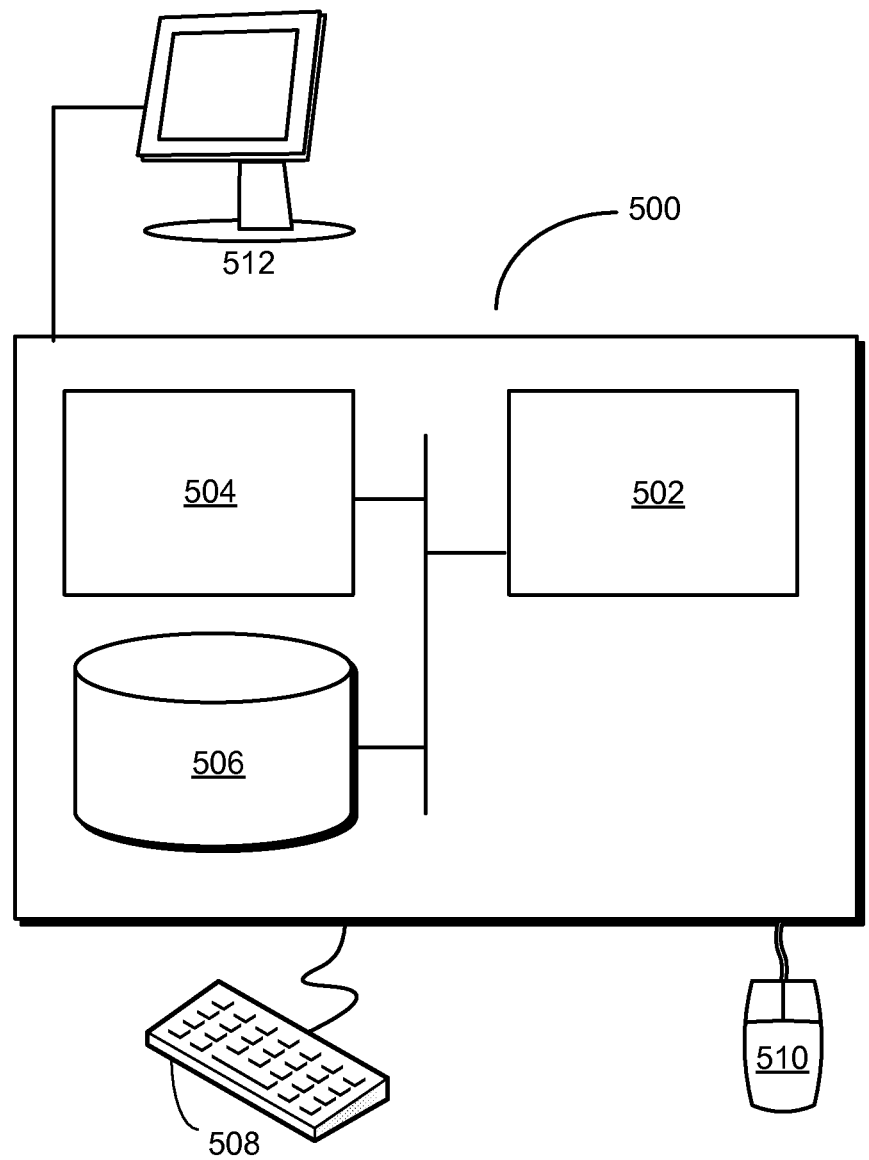
FIG. 5 shows a computer system in accordance with an embodiment.

FIG. 5 shows a computer system 500 in accordance with an embodiment. Computer system 500 includes a processor 502, memory 504, storage 506, and/or other components found in peripheral devices, portable electronic devices, and/or consumer electronic devices. Processor 502 may support parallel processing and/or multi-threaded operation with other processors in computer system 500. Computer system 500 may also include input/output (I/O) devices such as a keyboard 508, a mouse 510, and a display 512.

Computer system 500 may include functionality to execute various components of the present embodiments. In particular, computer system 500 may include an operating system (not shown) that coordinates the use of hardware and software resources on computer system 500, as well as one or more applications that perform specialized tasks for the user. To perform tasks for the user, applications may obtain the use of hardware resources on computer system 500 from the operating system, as well as interact with the user through a hardware and/or software framework provided by the operating system.

In one or more embodiments, computer system 500 provides a system for facilitating use of an electronic device. The system may include a charger that applies a pulse load to the battery. The system may include an ADC that measures a loaded voltage of a calibrated voltage source connected to the electronic device. The system may also include an MCU that calculates a parasitic resistance of the electronic device based on the loaded voltage, a known internal voltage of the calibrated voltage source, and a known internal resistance of the calibrated voltage source.

The MCU may use the parasitic resistance to facilitate use of the electronic device with a battery. For example, the MCU may store the parasitic resistance in the electronic device and calculate an internal resistance of the battery based on the parasitic resistance. The MCU may then use the internal resistance to identify a battery type of the battery, determine a state of charge of the battery based on the battery type, use the battery to power the electronic device based on the state of charge, and/or charge the battery based on the state of charge and the battery type.

In addition, one or more components of computer system 500 may be remotely located and connected to the other components over a network. Portions of the present embodiments (e.g., ADC, MCU, etc.) may also be located on different nodes of a distributed system that implements the embodiments. For example, the present embodiments may be implemented using a cloud computing system that monitors and manages batteries in remote electronic devices.

The foregoing descriptions of various embodiments have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention.

What is claimed is:

1. A method for configuring an electronic device, comprising:
by the electronic device, performing operations for:
measuring a loaded voltage of a calibrated voltage source connected to the electronic device;
calculating a parasitic resistance of the electronic device based on the loaded voltage, a known internal voltage of the calibrated voltage source, and a known internal resistance of the calibrated voltage source; and
using the parasitic resistance to enable operation of the electronic device using a battery.

2. The method of claim 1, wherein measuring a loaded voltage of a calibrated voltage source connected to the electronic device involves:
connecting the calibrated voltage source to a known load in the electronic device; and
obtaining a voltage measurement for the calibrated voltage source using an analog-to-digital converter (ADC) in the electronic device.

3. The method of claim 1, wherein calculating the parasitic resistance of the electronic device involves:
calculating an internal resistance of the calibrated voltage source from the loaded voltage, the known internal voltage, and the known internal resistance using a microcontroller unit (MCU) in the electronic device; and
subtracting the known internal resistance from the calculated internal resistance.

4. The method of claim 1, wherein using the parasitic resistance to enable operation of the electronic device using a battery involves:
storing the parasitic resistance in the electronic device; and
calculating an internal resistance of the battery based on the parasitic resistance.

5. The method of claim 4, wherein using the parasitic resistance to enable operation of the electronic device using a battery further involves at least one of:
using the internal resistance to identify a battery type of the battery;
determining a state of charge of the battery based on the battery type;
using the battery to power the electronic device based on the state of charge; and
charging the battery based on the state of charge and the battery type.

6. The method of claim 5, wherein the battery type corresponds to a rechargeable battery or a non-rechargeable battery.

7. The method of claim 1, wherein the electronic device is at least one of a keyboard, a mouse, a trackpad, a remote control, a wireless phone, a toy, a battery charger, and a camera.

8. An electronic device, comprising:
an analog-to-digital converter (ADC) configured to measure a loaded voltage of a calibrated voltage source connected to the electronic device; and
a microcontroller unit (MCU) configured to:
calculate a parasitic resistance of the electronic device based on the loaded voltage, a known internal voltage of the calibrated voltage source, and a known internal resistance of the calibrated voltage source; and
use the parasitic resistance to enable operation of the electronic device using a battery.

9. The electronic device of claim 8, wherein measuring the loaded voltage of the calibrated voltage source involves:
connecting the calibrated voltage source to a known load in the electronic device; and
obtaining a voltage measurement for the calibrated voltage source.

10. The electronic device of claim 8, wherein calculating the parasitic resistance of the electronic device involves:
calculating an internal resistance of the calibrated voltage source from the loaded voltage, the known internal voltage, and the known internal resistance; and
subtracting the known internal resistance from the calculated internal resistance.

11. The electronic device of claim 8, wherein using the parasitic resistance to enable operation of the electronic device using a battery involves:
storing the parasitic resistance in the electronic device; and
calculating an internal resistance of the battery based on the parasitic resistance.

12. The electronic device of claim 11, wherein using the parasitic resistance to enable operation of the electronic device using a battery further involves at least one of:
using the internal resistance to identify a battery type of the battery;
determining a state of charge of the battery based on the battery type;
using the battery to power the electronic device based on the state of charge; and
charging the battery based on the state of charge and the battery type.

13. A system for facilitating use of an electronic device, comprising:
an analog-to-digital converter (ADC) configured to measure a loaded voltage of a calibrated voltage source connected to the electronic device; and
a microcontroller unit (MCU) in the electronic device, wherein the MCU is configured to:
calculate a parasitic resistance of the electronic device based on the loaded voltage, a known internal voltage of the calibrated voltage source, and a known internal resistance of the calibrated voltage source; and
use the parasitic resistance to enable operation of the electronic device using a battery.

14. The system of claim 13, wherein using the parasitic resistance to enable operation of the electronic device using a battery involves:
storing the parasitic resistance in the electronic device; and
calculating an internal resistance of the battery based on the parasitic resistance.

15. The system of claim 14, wherein using the parasitic resistance to enable operation of the electronic device using a battery further involves at least one of:
using the internal resistance to identify a battery type of the battery;
determining a state of charge of the battery based on the battery type;
using the battery to power the electronic device based on the state of charge; and
charging the battery based on the state of charge and the battery type.

16. The system of claim 14, wherein calculating the internal resistance of the battery based on the parasitic resistance involves:
measuring an open circuit voltage of the battery;
measuring a loaded voltage of the battery;
calculating the internal resistance using the open circuit voltage and the loaded voltage; and
subtracting the parasitic resistance from the internal resistance.

* * * * *